US012564015B2

(12) United States Patent
Voleti et al.

(10) Patent No.: US 12,564,015 B2
(45) Date of Patent: Feb. 24, 2026

(54) INTEGRATED INSPECTION FOR ENHANCED HYBRID BONDING YIELD IN ADVANCED SEMICONDUCTOR PACKAGING MANUFACTURING

(71) Applicant: Applied Materials, Inc., Santa Clara, CA (US)

(72) Inventors: Venkatakaushik Voleti, San Jose, CA (US); Kyle Tantiwong, Livermore, CA (US); Mehdi Vaez-Iravani, Los Gatos, CA (US)

(73) Assignee: Applied Materials Inc., Santa Clara, CA (US)

( * ) Notice: Subject to any disclaimer, the term of this patent is extended or adjusted under 35 U.S.C. 154(b) by 385 days.

(21) Appl. No.: 18/141,306

(22) Filed: Apr. 28, 2023

(65) Prior Publication Data

US 2024/0363446 A1     Oct. 31, 2024

(51) Int. Cl.
*H01L 21/66* (2006.01)
*H01L 21/67* (2006.01)
*H01L 23/00* (2006.01)

(52) U.S. Cl.
CPC ........ *H01L 22/12* (2013.01); *H01L 21/67144* (2013.01); *H01L 21/67288* (2013.01); *H01L 24/80* (2013.01); *H01L 2224/8001* (2013.01); *H01L 2224/80895* (2013.01); *H01L 2224/80896* (2013.01); *H01L 2224/80908* (2013.01)

(58) Field of Classification Search
None
See application file for complete search history.

(56) References Cited

U.S. PATENT DOCUMENTS

| | | | |
|---|---|---|---|
| 8,640,548 B2 | 2/2014 | Wimplinger | |
| 2003/0040193 A1* | 2/2003 | Bailey | H01L 21/67017 156/345.47 |
| 2018/0144999 A1 | 5/2018 | Lu et al. | |
| 2019/0051628 A1* | 2/2019 | Liu | H01L 24/74 |
| 2020/0006052 A1* | 1/2020 | Huang | B23K 20/24 |
| 2020/0043812 A1 | 2/2020 | Lin et al. | |
| 2020/0371046 A1 | 11/2020 | Wang et al. | |

(Continued)

FOREIGN PATENT DOCUMENTS

CN     111916346 A     11/2020

OTHER PUBLICATIONS

PCT International Search Report and Written Opinion for PCT/US2024/012835 dated May 23, 2024.

*Primary Examiner* — Khaja Ahmad
(74) *Attorney, Agent, or Firm* — Moser Taboada

(57) ABSTRACT

Methods and apparatus of hybrid bonding with inspection are provided herein. In some embodiments, a method of hybrid bonding with inspection includes: cleaning a substrate via a first cleaning chamber and a tape frame having a plurality of chiplets via a second cleaning chamber; inspecting, via a first metrology system, the substrate for pre-bond defects in a first metrology chamber and the tape frame for pre-bond defects in a second metrology chamber; bonding one or more of the plurality of chiplets to the substrate via a hybrid bonding process in a bonder chamber to form a bonded substrate; and performing, via a second metrology system different than the first metrology system, a post-bond inspection of the bonded substrate via a third metrology chamber for post-bond defects.

6 Claims, 5 Drawing Sheets

(56)        References Cited

U.S. PATENT DOCUMENTS

| | | | | |
|---|---|---|---|---|
| 2021/0166953 A1* | 6/2021 | Hsiung | ................. | H01L 23/367 |
| 2021/0330431 A1 | 10/2021 | Yang et al. | | |
| 2021/0375850 A1* | 12/2021 | Uzoh | ...................... | H01L 24/27 |
| 2022/0262652 A1 | 8/2022 | Harris et al. | | |
| 2023/0129590 A1 | 4/2023 | Wang et al. | | |

* cited by examiner

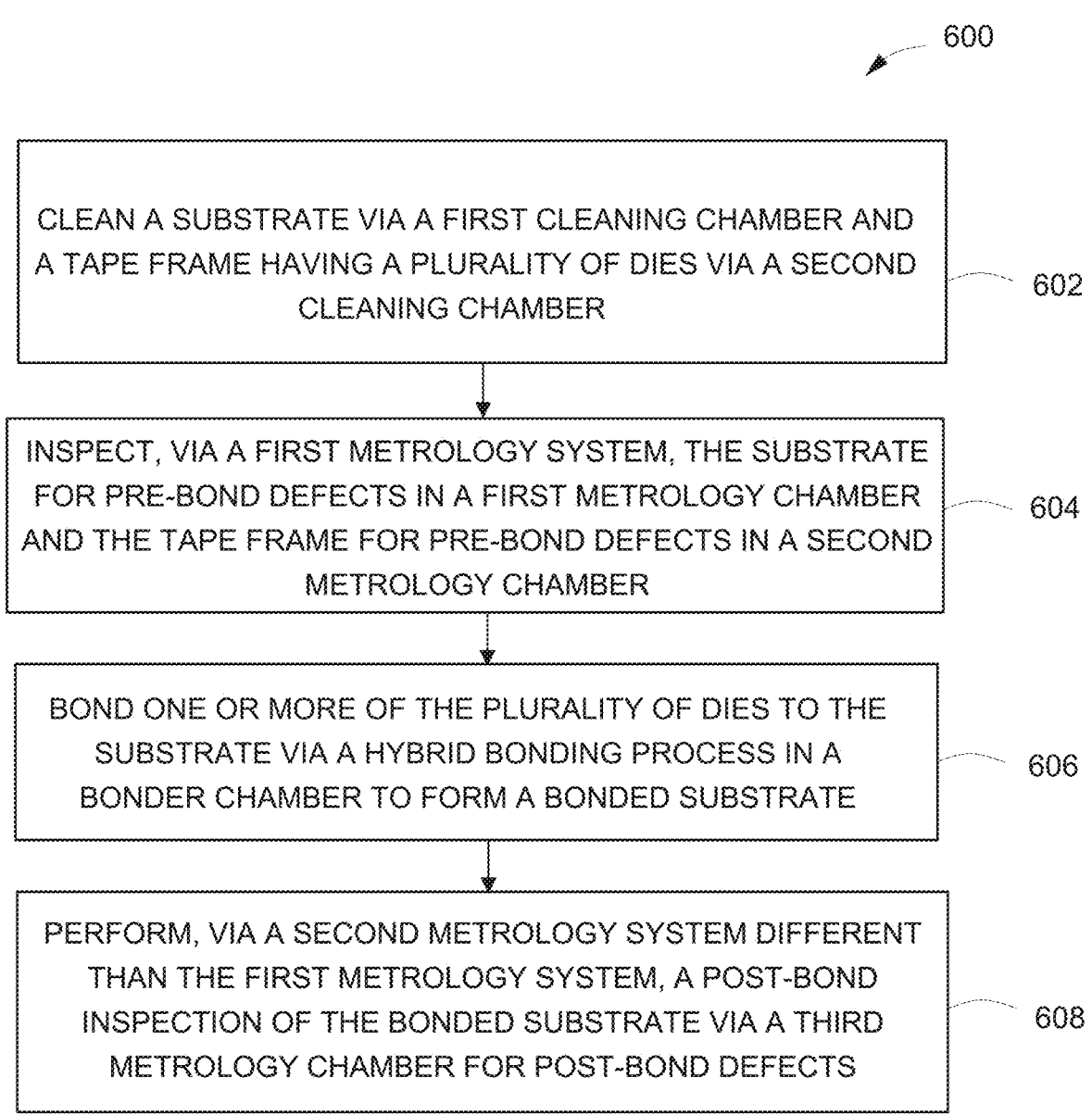

600

CLEAN A SUBSTRATE VIA A FIRST CLEANING CHAMBER AND A TAPE FRAME HAVING A PLURALITY OF DIES VIA A SECOND CLEANING CHAMBER — 602

INSPECT, VIA A FIRST METROLOGY SYSTEM, THE SUBSTRATE FOR PRE-BOND DEFECTS IN A FIRST METROLOGY CHAMBER AND THE TAPE FRAME FOR PRE-BOND DEFECTS IN A SECOND METROLOGY CHAMBER — 604

BOND ONE OR MORE OF THE PLURALITY OF DIES TO THE SUBSTRATE VIA A HYBRID BONDING PROCESS IN A BONDER CHAMBER TO FORM A BONDED SUBSTRATE — 606

PERFORM, VIA A SECOND METROLOGY SYSTEM DIFFERENT THAN THE FIRST METROLOGY SYSTEM, A POST-BOND INSPECTION OF THE BONDED SUBSTRATE VIA A THIRD METROLOGY CHAMBER FOR POST-BOND DEFECTS — 608

FIG. 6

INTEGRATED INSPECTION FOR ENHANCED HYBRID BONDING YIELD IN ADVANCED SEMICONDUCTOR PACKAGING MANUFACTURING

FIELD

Embodiments of the present disclosure generally relate to substrate processing equipment.

BACKGROUND

Substrates undergo various processes during the fabrication of semiconductor integrated circuit devices. Some of these processes include wafer dicing, in which a processed wafer is placed on a dicing tape and is cut or separated into a plurality of die or chiplets. Once the wafer has been diced, the chiplets typically stay on the dicing tape until they are extracted and bonded to a substrate, via for example, a hybrid bonding process. Hybrid bonding generally comprises stacking and electrically connecting one or more dies to a substrate. However, any pre-bonding defects such as cracked or chipped dies or particulates on the bonding surface can lead to post bonding issues. Further, defects such as misalignment, voids, or delamination found post bonding can negatively affect yield and require increased tool downtime for identifying and servicing the tools performing the hybrid bonding process.

Accordingly, the inventors have provided improved multi-chamber processing tools for processing substrates via hybrid bonding techniques.

SUMMARY

Methods and apparatus of hybrid bonding with inspection are provided herein. In some embodiments, a method of hybrid bonding with inspection includes: cleaning a substrate via a first cleaning chamber and a tape frame having a plurality of chiplets via a second cleaning chamber; inspecting, via a first metrology system, the substrate for pre-bond defects in a first metrology chamber and the tape frame for pre-bond defects in a second metrology chamber; bonding one or more of the plurality of chiplets to the substrate via a hybrid bonding process in a bonder chamber to form a bonded substrate; and performing, via a second metrology system different than the first metrology system, a post-bond inspection of the bonded substrate via a third metrology chamber for post-bond defects.

In some embodiments, a non-transitory computer readable medium having instructions stored thereon, that when executed by one or more processers, perform a method of hybrid bonding with inspection that includes: cleaning a substrate via a first cleaning chamber and a tape frame having a plurality of chiplets via a second cleaning chamber; inspecting, via a first metrology system, the substrate for pre-bond defects in a first metrology chamber and the tape frame for pre-bond defects in a second metrology chamber; bonding one or more of the plurality of chiplets to the substrate via a hybrid bonding process in a bonder chamber to form a bonded substrate; and performing, via a second metrology system different than the first metrology system, a post-bond inspection of the bonded substrate via a third metrology chamber for post-bond defects.

In some embodiments, a multi-chamber processing tool for bonding chiplets to a substrate includes: an equipment front end module (EFEM) having one or more substrate loadports for receiving the substrate and one or more tape frame loadports for receiving a tape frame having a plurality of chiplets; and a plurality of automation modules having a first automation module coupled to the FI, wherein each of the plurality of automation modules include a transfer chamber and one or more process chambers coupled to the transfer chamber, wherein the one or more process chambers include a bonder chamber, wherein the transfer chamber includes a buffer configured to hold one or more of the substrates and one or more of the tape frames, and wherein the transfer chamber includes a transfer robot configured to transfer the substrate and the tape frame between the buffer, the one or more process chambers, and a buffer disposed in an adjacent automation module of the plurality of automation modules; a first metrology chamber coupled to one of the plurality of automation modules, wherein the first metrology chamber includes a first metrology system configured to obtain measurements of the substrate and a motion system configured to align the first metrology system to various parts of the substrate; and a second metrology chamber coupled to one of the plurality of automation modules, wherein the second metrology chamber includes a second metrology system different than the first metrology system and configured to obtain measurements of the substrate and a second motion system configured to align the second metrology system to various parts of the substrate.

Other and further embodiments of the present disclosure are described below.

BRIEF DESCRIPTION OF THE DRAWINGS

Embodiments of the present disclosure, briefly summarized above and discussed in greater detail below, can be understood by reference to the illustrative embodiments of the disclosure depicted in the appended drawings. However, the appended drawings illustrate only typical embodiments of the disclosure and are therefore not to be considered limiting of scope, for the disclosure may admit to other equally effective embodiments.

FIG. 6 depicts a flow chart of a method of hybrid bonding with inspection in accordance with at least some embodiments of the present disclosure.

Figure 1:
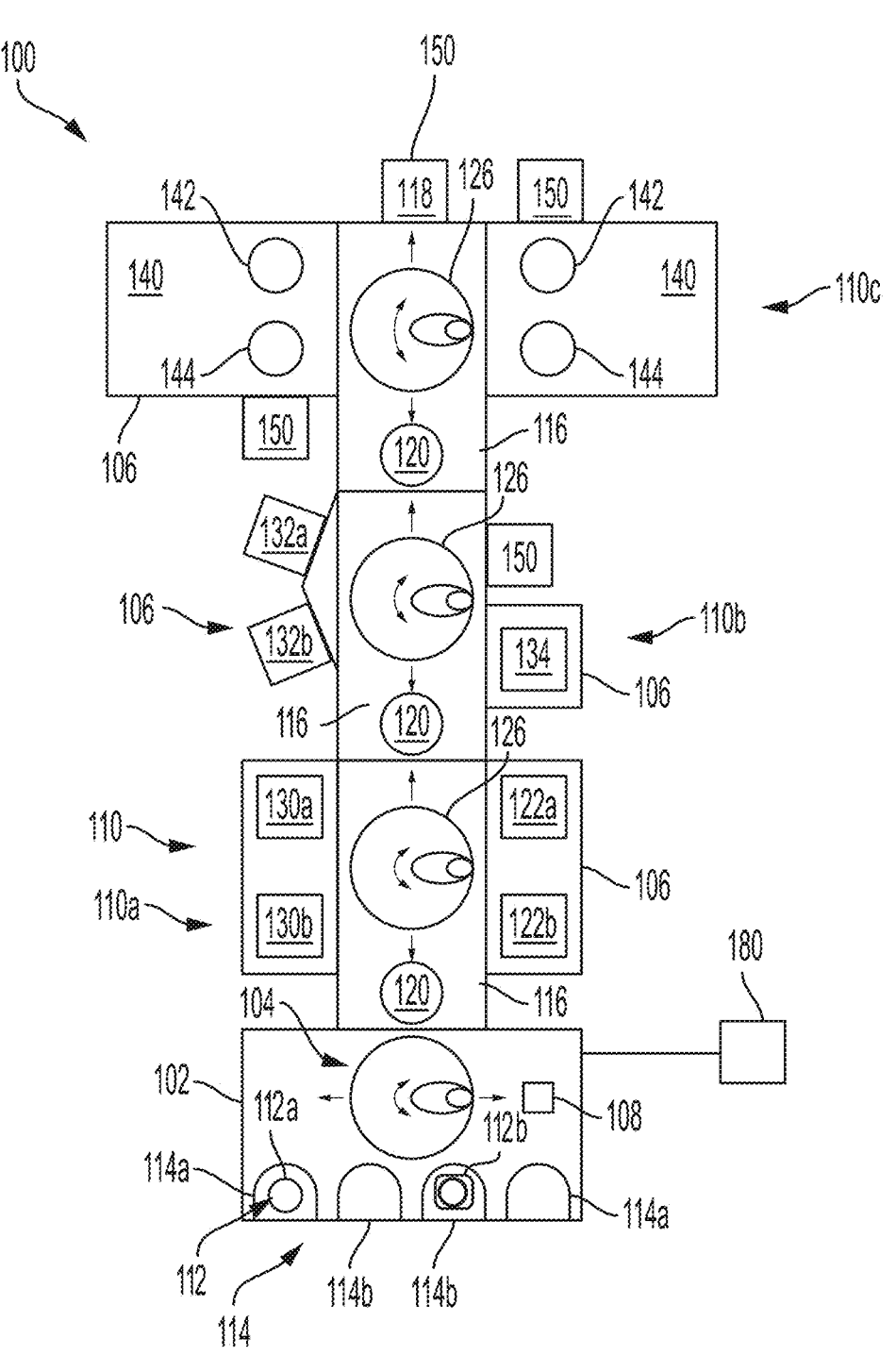
FIG. 1 depicts a schematic top view of a multi-chamber processing tool in accordance with at least some embodiments of the present disclosure.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

Embodiments of a methods and apparatus of hybrid bonding with inspection are provided herein. The methods generally include automated processing and inspection of substrates undergoing hybrid bonding. The inspection may comprise checking for pre-bond defects and post-bond defects. The inspection may be performed in-situ in a multi-chamber processing tool configured for hybrid bonding. For example, the apparatus provided herein may include metrology systems, such as optical systems or non-optical measurement systems that look for pre-bond defects such as particles, cracks, proper surface activation, or the like, or optical systems or non-optical measurement systems that look for post-bond defects, such as die alignment, delamination, voids, or the like. Based on measurements or data obtained from the metrology systems, the multi-chamber processing tool may be configured to discard defected substrates or dies, adjust processing parameters, or perform additional processing on the substrates.

FIG. 1 depicts a schematic top view of a multi-chamber processing tool in accordance with at least some embodiments of the present disclosure. The multi-chamber process tool 100 generally includes an equipment front end module (EFEM) 102 and a plurality of atmospheric modular mainframes (AMMs) 110, or automation modules, that are serially coupled to the EFEM 102. The plurality of AMMs 110 are configured to shuttle one or more types of substrates 112 from the EFEM 102 through the multi-chamber process tool 100 and perform one or more processing steps to the one or more types of substrates 112. Each of the plurality of AMMs 110 generally include a transfer chamber 116 and one or more process chambers 106 coupled to the transfer chamber 116 to perform the one or more processing steps. The plurality of AMMs 110 are coupled to each other via their respective transfer chamber 116 to advantageously provide modular expandability and customization of the multi-chamber process tool 100. As depicted in FIG. 1, the plurality of AMMs 110 comprise three AMMs, where a first AMM 110a is coupled to the EFEM 102, a second AMM 110b is coupled to the first AMM 110a, and a third AMM 110c is coupled to the second AMM 110b. However, the plurality of AMMs 110 may comprise any number of AMMs needed for substrate processing.

The EFEM 102 includes a plurality of loadports 114 for receiving one or more types of substrates 112. In some embodiments, the one or more types of substrates 112 include 200 mm wafers, 300 mm wafers, 450 mm wafers, tape frame substrates, carrier substrates, silicon substrates, glass substrates, or the like. In some embodiments, the plurality of loadports 114 include at least one of one or more first loadports 114a for receiving a first type of substrate 112a or one or more second loadports 114b for receiving a second type of substrate 112b. In some embodiments, the first type of substrates 112a have a different size than the second type of substrates 112b. In some embodiments, the second type of substrates 112b include tape frame substrates or carrier substrates. In some embodiments, the second type of substrates 112b include a plurality of chiplets disposed on a tape frame or carrier plate. In some embodiments, the second type of substrates 112b may hold different types and sizes of chiplets. As such, the one or more second loadports 114b may have different sizes or receiving surfaces configured to load the second type of substrates 112b having different sizes.

In some embodiments, the EFEM 102 includes a scanning station 108 having substrate ID readers for scanning the one or more types of substrates 112 for identifying information. In some embodiments, the substrate ID readers include a bar code reader or an optical character recognition (OCR) reader. The multi-chamber processing tool 100 is configured to use any identifying information from the one or more types of substrates 112 that are scanned to determine process steps based on the identifying information, for example, different process steps for the first type of substrates 112a and the second type of substrates 112b. In some embodiments, the scanning station 108 may also be configured for rotational movement to align the first type of substrates 112a or the second type of substrates 112b. In some embodiments, the one or more of the plurality of AMMs 110 include a scanning station 108.

An EFEM robot 104 is disposed in the EFEM 102 and configured to transport the first type of substrates 112a and the second type of substrates 112b between the plurality of loadports 114 to the scanning station 108. The EFEM robot 104 may include substrate end effectors for handling the first type of substrates 112a and second end effectors for handling the second type of substrates 112b. The EFEM robot 104 may rotate or rotate and move linearly.

Figure 2:
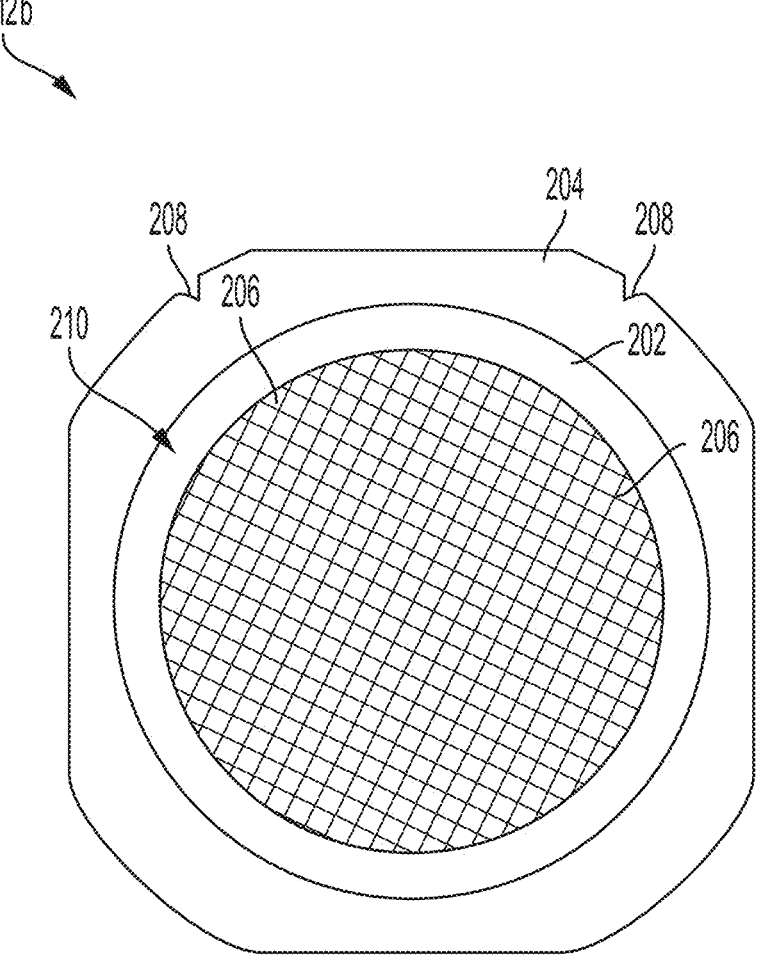
FIG. 2 depicts a top view of a tape frame in accordance with at least some embodiments of the present disclosure.

FIG. 2 depicts a top view of a tape frame in accordance with at least some embodiments of the present disclosure. In some embodiments, the second type of substrate 112b is a tape frame, or tape frame substrate, that generally comprises a layer of backing tape 202 surrounded by a tape frame 204. In use, a plurality of chiplets 206 can be attached to the backing tape 202. The plurality of chiplets 206 are generally formed via a singulation process that dices a semiconductor wafer 210 into the plurality of chiplets 206 or dies. In some embodiments, the tape frame 204 is made of metal, such as stainless steel. The tape frame 204 may have one or more notches 208 to facilitate alignment and handling. For a semiconductor wafer 210 having a 300 mm diameter, the tape frame 204 may have a width of about 340 mm to about 420 mm and a length of about 340 mm to about 420 mm. The second type of substrate 112b may alternatively be a carrier plate configured to have the plurality of chiplets 206 coupled to the carrier plate.

Referring back to FIG. 1, the one or more process chambers 106 may be sealingly engaged with the transfer chamber 116. The transfer chamber 116 generally operates at atmospheric pressure but may be configured to operate at vacuum pressure. For example, the transfer chamber 116 may be a non-vacuum chamber configured to operate at an atmospheric pressure of about 700 Torr or greater. Additionally, while the one or more process chambers 106 are generally depicted as orthogonal to the transfer chamber 116, the one or more process chambers 106 may be disposed at an angle with respect to the transfer chamber 116 or a combination of orthogonal and at an angle. For example, the second AMM 110b depicts a pair of the one or more process chambers 106 disposed at an angle with respect to the transfer chamber 116.

The transfer chamber 116 includes a buffer 120 configured to hold one or more first type of substrates 112a. In some embodiments, the buffer 120 is configured to hold one or more of the first type of substrates 112a and one or more of the second type of substrates 112b. The transfer chamber 116 includes a transfer robot 126 configured to transfer the first type of substrates 112a and the second type of substrates 112b between the buffer 120, the one or more process chambers 106, and a buffer disposed in an adjacent AMM of the plurality of AMMs 110. For example, the transfer robot 126 in the first AMM 110a is configured to transfer the first type of substrates 112a and the second type of substrates 112b between the first AMM 110a and the buffer 120 in the second AMM 110b. In some embodiments, the buffer 120 is disposed within the interior volume of the transfer chamber 116, advantageously reducing the footprint of the overall tool. In addition, the buffer 120 can be open to the interior volume of the transfer chamber 116 for ease of access by the transfer robot 126. In some embodiments, the buffer 120 may also be configured to perform a radiation process on the second type of substrates 112b.

The transfer chamber 116 may have one or more environmental controls. For example, an airflow opening in the transfer chamber 116 may include a filter to filter the airflow entering the transfer chamber 116. Other environmental controls may include one or more of humidity control, static control, temperature control, or pressure control. The buffer 120 is configured to rotate to align the first type of substrates 112a and the second type of substrates 112b in a desired manner. In some embodiments, the buffer 120 is configured to hold the one or more types of substrates 112 in a vertical stack advantageously reducing the footprint of the transfer chamber 116. For example, in some embodiments, the buffer 120 includes a plurality of shelves for storing or holding one or more first type of substrates 112a and one or more second type of substrates 112b.

Referring back to FIG. 1, the one or more process chambers 106 may include atmospheric chambers that are configured to operate under atmospheric pressure and vacuum chambers that are configured to operate under vacuum pressure. Examples of the atmospheric chambers may generally include wet clean chambers, radiation chambers, heating chambers, metrology chambers, bonding chambers, or the like. Examples of vacuum chambers may include plasma chambers. The types of atmospheric chambers discussed above may also be configured to operate under vacuum, if needed. The one or more process chambers 106 may be any process chambers or modules needed to perform a bonding process, a dicing process, a cleaning process, a plating process, or the like.

In some embodiments, the one or more process chambers 106 of each of the plurality of AMMs 110 include at least one of a wet clean chamber 122, a plasma chamber 130, a degas chamber 132, a radiation chamber 134, or a bonder chamber 140 such that the multi-chamber processing tool 100 includes at least one wet clean chamber 122, at least one plasma chamber 130, at least one degas chamber 132, at least one radiation chamber 134, and at least one bonder chamber 140.

The wet clean chamber 122 is configured to perform a wet clean process to clean the one or more types of substrates 112 via a fluid, such as water. The wet clean chamber 122 may include a first wet clean chamber 122a for cleaning the first type of substrates 112a or a second wet clean chamber 122b for cleaning the second type of substrates 112b. The degas chamber 132 is configured to perform a degas process to remove moisture from the substrates 112 via for example, a high temperature baking process. In some embodiments, the degas chamber 132 includes a first degas chamber 132a for the first type of substrates 112a and a second degas chamber 132b for the second type of substrates 112b.

The plasma chamber 130 may be configured to perform an etch process to remove unwanted material, for example organic materials and oxides, from the first type of substrates 112a or the second type of substrates 112b. In some embodiments, the plasma chamber 130 includes a first plasma chamber 130a for the first type of substrates 112a and a second plasma chamber 130b for the second type of substrates 112b. The plasma chamber 130 may also be configured to perform an etch process to dice the substrates 112 into chiplets. In some embodiments, the plasma chamber 130 may be configured to perform a deposition process, for example, a physical vapor deposition process, a chemical vapor deposition process, or the like, to coat the first type of substrates 112a or the second type of substrates 112b with a desired layer of material.

The radiation chamber 134 is configured to perform a radiation process on the second type of substrates 112b to reduce adhesion between the plurality of chiplets 206 and the backing tape 202. For example, the radiation chamber 134 may be an ultraviolet radiation chamber configured to direct ultraviolet radiation at the backing tape 202 or a heating chamber configured to heat the backing tape 202. The bonder chamber 140 is configured to transfer and bond at least a portion of the plurality of chiplets 206 to one of the first type of substrates 112a. The bonder chamber 140 generally includes a first support 142 to support one of the first type of substrates 112a and a second support 144 to support one of the second type of substrates 112b.

In some embodiments, a last AMM of the plurality of AMM 110, for example the third AMM 110c of FIG. 1, includes one or more bonder chambers 140 (two shown in FIG. 1). In some embodiments, a first of the two bonder chambers is configured to remove and bond chiplets having a first size and a second of the two bonder chambers is configured to remove and bond chiplets having a second size. In some embodiments, any of the plurality of AMMs 110 include one or more metrology chambers 150 configured to take measurements of the one or more types of substrates 112. In FIG. 1, one of the one or more metrology chambers 150 is shown as directly coupled to the transfer chamber 116 of the third AMM 110c. However, the one or more metrology chambers 150 may be coupled to any transfer chamber 116 or disposed within any of the transfer chamber 116. The one or more metrology chambers 150 may be directly coupled to one or more of the bonder chambers 140 for ease of pre-bond or post-bond inspection.

The one or more metrology chambers 150 generally include a metrology system 118 configured to obtain measurements of the one or more types of substrates 112. For example, a first metrology chamber of the one or more metrology chambers 150 includes a first metrology system configured to obtain measurements of the one or more types of substrates 112 using, for example, a first optical imaging system. The first metrology system may include a motion system configured to align the first metrology system to various parts of the substrate being inspected. The first optical system may comprise a first microscope. In some embodiments, the first metrology system is a non-optical system, for example, a system configured for obtaining weight-based measurements, electrical field measurements, radiation measurements, ultrasonic measurements, or the like, to determine bond defects.

In some embodiments, a second metrology chamber is coupled to one of the plurality of AMMs 110 and includes a second metrology system configured to obtain measurements of the substrate using, for example, a second optical imaging system different than the first optical imaging system. The second metrology system may include a second motion system configured to align the second metrology system to various parts of the substrate being inspected. The second optical imaging system may comprise a second microscope different than the first microscope. In some embodiments, the second imaging system is a non-optical system, for example, a system configured for obtaining weight-based measurements, electrical field measurements, radiation measurements, ultrasonic measurements, or the like.

In some embodiments, the first metrology chamber is directly coupled to one of the transfer chambers, and the second metrology chamber is directed coupled to another one of the transfer chambers. In some embodiments, the first metrology chamber is directly coupled to one of the bonder chambers 140. In some embodiments, the first metrology chamber and the second metrology chamber are directly coupled to a same one of the one or more bonder chambers 140. In some embodiments, the first optical imaging system includes an infrared microscope and the second optical imaging system includes a light microscope or ultraviolet microscope. In some embodiments, the first optical imaging system includes an infrared microscope and the second optical imaging system includes an infrared microscope. Infrared microscopes may be used, for example, for penetrating the dielectric layers of the plurality of chiplets and capturing imagery of a bonding interface between a substrate and the chiplets that is not visible.

In some embodiments, the first metrology chamber and the second metrology chamber are the same chamber. In such embodiments, the metrology system 118 in the metrology chamber 150 may include multiple optical systems. For example, the metrology system 118 may include at least two of an infrared microscope, a light microscope, or an ultraviolet microscope. In some embodiments, the first metrology chamber may be configured for inspecting the first type of substrate 112a. In some embodiments, the second metrology chamber may be configured for inspecting the second type of substrate 112a.

In some embodiments, the one or more metrology chambers 150 include a third metrology chamber having a third optical system configured to obtain measurements of the substrate using a third microscope. In some embodiments, the third metrology chamber is configured to inspect a post-bonded substrate. The third metrology chamber may be directly coupled to one of the transfer chambers 116 or bonder chambers 140. In some embodiments, the third metrology chamber includes an infrared microscope.

A master controller 180 controls the operation of any of the multi-chamber processing tools described herein, including the multi-chamber processing tool 100. The master controller 180 may use a direct control of the multi-chamber processing tool 100, or alternatively, by controlling the computers (or controllers) associated with the multi-chamber processing tool 100. In operation, the master controller 180 enables data collection and feedback from the multi-chamber processing tool 100 to optimize performance of the multi-chamber processing tool 100.

Figure 3A:
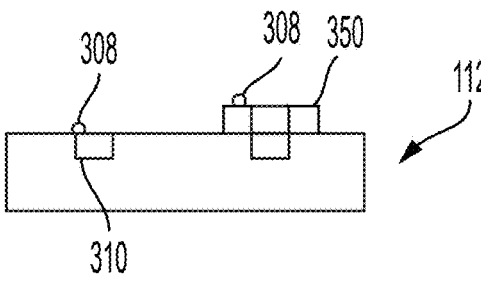
FIGS. 3A-3B depict schematic side views of pre-bond defects in accordance with at least some embodiments of the present disclosure.
Figure 3B:
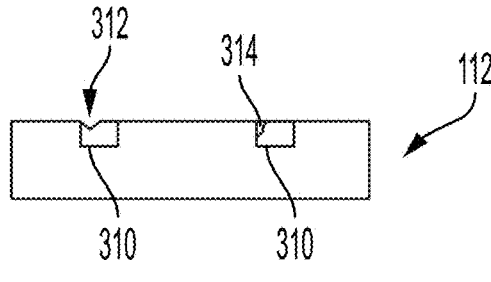

FIGS. 3A-3B depict schematic side views of pre-bond defects in accordance with at least some embodiments of the present disclosure. FIG. 3A depicts a pre-bond defect comprising a contaminant such as a particle 308 disposed on the one or more substrates 112. As shown in FIG. 3A, the substrate is the first type of substrate 112A. However, the substrate may be the second type of substrate 112B. The first type of substrate 112A includes one or more metal pads 310 for providing electrical connection with the plurality of chiplets 206 when bonded to the first type of substrate 112A. FIG. 3B depicts a pre-bond defect where one of the one or more metal pads 310 includes a chipped portion 312. FIG. 3B also depicts a pre-bond defect where one of the one or more metal pads 310 includes a crack 314. In some embodiments, the first type of substrate 112A includes one or more bonded chiplets 350 and the pre-bond defect is in or on one or more of the one or more bonded chiplets 350. For example, the one or more bonded chiplets 350 may include unwanted particles, chipped portions, or cracked portions. The plurality of chiplets 206 of the second type of substrate 112B may be bonded next to or on top of the one or more bonded chiplets 350. For example, FIG. 4B depicts one of the plurality of chiplets 206 bonded on top of one of the one or more bonded chiplets 350.

Figure 4A:
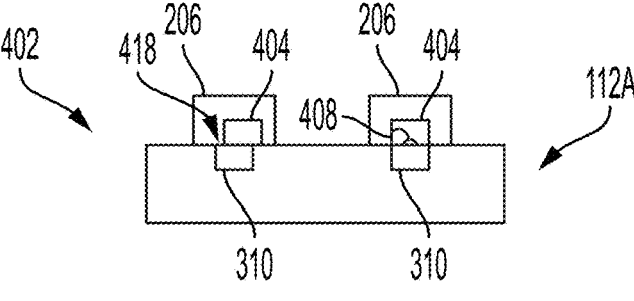
FIGS. 4A-4B depict schematic side views of post-bond defects in accordance with at least some embodiments of the present disclosure.
Figure 4B:
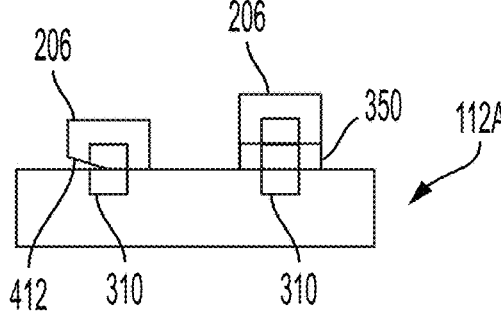

FIGS. 4A-4B depict schematic side views of post-bond defects in accordance with at least some embodiments of the present disclosure. FIG. 4A depicts a plurality of chiplets 206 bonded to the first type of substrate 112A. The plurality of chiplets 206 include one or more second metal pads 404 for providing electrical connection with the first type of substrate 112A when aligned with the one or more metal pads 310. In some embodiments, one or more of the plurality of chiplets 206 have a second metal pad 404 that is misaligned 418 with the one or more metal pads 310. In some embodiments, a void 408 is disposed between the one or more metal pads 310 and the one or more second metal pads 404. FIG. 4B depicts a plurality of chiplets 206 bonded to the first type of substrate 112A, where an interface between one of the plurality of chiplets 206 and first type of substrate 112B has a delamination defect 412.

Figure 5:
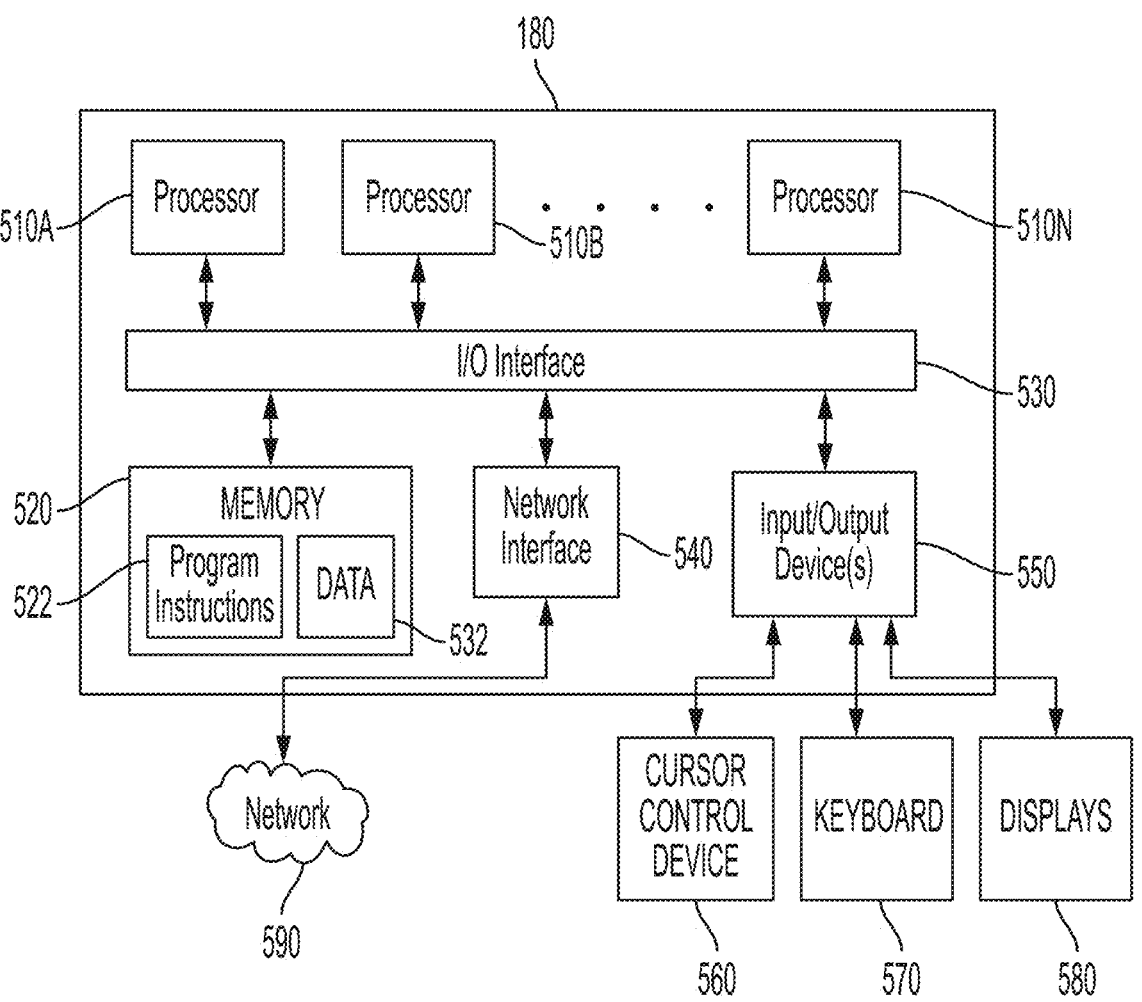
FIG. 5 depicts a high-level block diagram of a master controller of a multi-chamber processing tool in accordance with at least some embodiments of the present disclosure.

FIG. 5 depicts a high-level block diagram of a master controller 180 of a multi-chamber processing tool in accordance with at least some embodiments of the present disclosure. Various embodiments of the method of hybrid bonding with inspection, as described herein, may be executed using one or more controllers, which may interact with each other, and which may interact with various other devices. One such controller is the master controller 180. In some embodiments, the master controller 180 may be configured to implement methods described herein. The master controller 180 may be used to implement any other system, device, element, functionality, or method of the herein-described embodiments. In some embodiments, the master controller 180 may be configured to implement the method 600 of FIG. 6 as processor-executable program instructions 522 (e.g., program instructions executable by processor(s) 510) in various embodiments. In some embodiments, one or more of the one or more process chambers 106 may include a respective controller to interact with the master controller 180.

In some embodiments, the master controller 180 includes one or more processors 510A-510N coupled to a system memory 520 via an input/output (I/O) interface 530. Master controller 180 may further include a network interface 540 coupled to the I/O interface 530, and one or more input/output devices 550, such as cursor control device 560, keyboard 570, and display(s) 580. In various embodiments, any of the components may be utilized by the system to receive user input described above. In various embodiments, a user interface may be generated and displayed on display 580. In some cases, embodiments may be implemented using a single instance of master controller 180, while in other embodiments multiple such systems, or multiple nodes making up the master controller 180, may be configured to host different portions or instances of various embodiments. For example, in one embodiment some elements may be implemented via one or more nodes of master controller 180 that are distinct from those nodes implementing other elements. In another example, multiple nodes may implement master controller 180 in a distributed manner.

In some embodiments, the master controller 180 may be any of various types of devices, including, but not limited to, a personal computer system, desktop computer, laptop, notebook, tablet or netbook computer, mainframe computer system, handheld computer, workstation, network computer, or in general any type of computing or electronic device.

In various embodiments, the master controller 180 may be a uniprocessor system including one processor 510, or a multiprocessor system including several 510 (e.g., two, four, eight, or another suitable number). Processors 510 may be any suitable processor capable of executing instructions. For example, in various embodiments, processors 510 may be general-purpose or embedded processors implementing any of a variety of instruction set architectures (ISAs). In multiprocessor systems, each of processors 510 may commonly, but not necessarily, implement the same ISA.

System memory 520 may be configured to store program instructions 522 and/or data 532 accessible by processor 510. In various embodiments, system memory 520 may be implemented using any suitable memory technology, such as static random-access memory (SRAM), synchronous dynamic RAM (SDRAM), nonvolatile/Flash-type memory, or any other type of memory. In the illustrated embodiment, program instructions and data implementing any of the elements of the embodiments described above may be stored within system memory 520. In other embodiments, program instructions and/or data may be received, sent or stored upon different types of computer-accessible media or on similar media separate from system memory 520 or the master controller 180.

In one embodiment, I/O interface 530 may be configured to coordinate I/O traffic between processor 510, system memory 520, and any peripheral devices in the device, including network interface 540 or other peripheral interfaces, such as input/output devices 550. In some embodiments, I/O interface 530 may perform any necessary protocol, timing, or other data transformations to convert data signals from one component (e.g., system memory 520) into a format suitable for use by another component (e.g., processor 510). In some embodiments, I/O interface 530 may include support for devices attached through various types of peripheral buses, such as a variant of the Peripheral Component Interconnect (PCI) bus standard or the Universal Serial Bus (USB) standard, for example. In some embodiments, the function of I/O interface 530 may be split into two or more separate components, such as a north bridge and a south bridge, for example. Also, in some embodiments some or all of the functionality of I/O interface 530, such as an interface to system memory 520, may be incorporated directly into processor 510.

Network interface 540 may be configured to allow data to be exchanged between the master controller 180 and other devices attached to a network (e.g., network 590), such as one or more external systems or between nodes of master controller 180. In various embodiments, network 590 may include one or more networks including but not limited to Local Area Networks (LANs) (e.g., an Ethernet or corporate network), Wide Area Networks (WANs) (e.g., the Internet), wireless data networks, some other electronic data network, or some combination thereof. In various embodiments, network interface 540 may support communication via wired or wireless general data networks, such as any suitable type of Ethernet network, for example; via digital fiber communications networks; via storage area networks such as Fiber Channel SANs, or via any other suitable type of network and/or protocol.

Input/output devices 550 may, in some embodiments, include one or more display terminals, keyboards, keypads, touchpads, scanning devices, voice or optical recognition devices, or any other devices suitable for entering or accessing data by one or more computer systems. Multiple input/output devices 550 may be present in master controller 180 or may be distributed on various nodes of master controller 180. In some embodiments, similar input/output devices may be separate from master controller 180 and may interact with one or more nodes of master controller 180 through a wired or wireless connection, such as over network interface 540.

Those skilled in the art will appreciate that master controller 180 is merely illustrative and is not intended to limit the scope of embodiments. In particular, the computer system and devices may include any combination of hardware or software that can perform the indicated functions of various embodiments, including computers, network devices, Internet appliances, PDAs, wireless phones, pagers, and the like. Master controller 180 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer readable medium that is non-transitory or a portable article to be read by an appropriate drive, various examples of which are described above. In some embodiments, instructions stored on a computer readable medium separate from master controller 180 may be transmitted to master controller 180 via transmission media or signals such as electrical, electromagnetic, or digital signals, conveyed via a communication medium such as a network and/or a wireless link. Various embodiments may further include receiving, sending or storing instructions and/or data implemented in accordance with the foregoing description upon a computer readable medium or via a communication medium. In general, a computer readable medium may include a storage medium or memory medium such as magnetic or optical media, e.g., disk or DVD/CD-ROM, volatile or non-volatile media such as RAM (e.g., SDRAM, DDR, RDRAM, SRAM, and the like), ROM, and the like.

The methods described herein may be implemented in software, hardware, or a combination thereof, in different embodiments. In addition, the order of methods may be changed, and various elements may be added, reordered, combined, omitted, or otherwise modified. All examples described herein are presented in a non-limiting manner. Various modifications and changes may be made as would be obvious to a person skilled in the art having benefit of the present disclosure. Realizations in accordance with embodiments have been described in the context of particular embodiments. These embodiments are meant to be illustrative and not limiting. Many variations, modifications, additions, and improvements are possible. Accordingly, plural instances may be provided for components described herein as a single instance. Boundaries between various components, operations and data stores are somewhat arbitrary, and particular operations are illustrated in the context of specific illustrative configurations. Other allocations of functionality are envisioned and may fall within the scope of claims that follow. Finally, structures and functionality presented as discrete components in the example configurations may be implemented as a combined structure or component. These and other variations, modifications, additions, and improvements may fall within the scope of embodiments as defined in the claims that follow.

Embodiments in accordance with the disclosure may be implemented in hardware, firmware, software, or any combination thereof. Embodiments may also be implemented as instructions stored using one or more machine-readable media, which may be read and executed by one or more processors. A machine-readable medium may include any mechanism for storing or transmitting information in a form readable by a machine (e.g., a computing device or a "virtual machine" running on one or more computing devices). For example, a machine-readable medium may include any suitable form of volatile or non-volatile memory.

In some embodiments, the master controller 180 is configured to use at least one of artificial intelligence techniques or machine learning techniques to refine parameters of hybrid bonding. In some embodiments, in accordance with the present principles, suitable machine learning techniques can be applied to learn commonalities in sequential application programs and for determining from the machine learning techniques at what level sequential application programs can be canonicalized. In some embodiments, machine learning techniques that can be applied to learn commonalities in sequential application programs can include, but are not limited to, regression methods, ensemble methods, or neural networks and deep learning such as 'Se2oSeq' Recurrent Neural Network (RNNs)/Long Short Term Memory (LSTM) networks, graph neural networks applied to the abstract syntax trees corresponding to the sequential program application.

In some embodiments, the machine learning techniques may receive data inputs from sensors and monitoring devices associated with the multi-chamber processing tool 100, along with user inputs. In some embodiments, the machine learning techniques may receive data inputs as imported data files. For example, data inputs may be derived from the one or more metrology chambers 150 performing pre-bond inspection or post-bond inspection as provided herein. The data collected from one or more of the above sources can be partially, or fully, combined to train the machine learning model.

The artificial intelligence techniques or machine learning techniques may be used to refine parameters of the hybrid bonding process. For example, parameters of the bonder chamber 140 may be refined if defects such as misalignment, voids, or delamination between dies and substrates are found post bonding. In other examples, cleaning or other processing steps may be repeated or refined if pre-bond defects or post-bond defects are found.

FIG. 6 depicts a flow chart of a method of hybrid bonding with inspection in accordance with at least some embodiments of the present disclosure. The method 600, at 602, includes cleaning a substrate (e.g., first type of substrate 112a) via a first cleaning chamber (e.g., first wet clean chamber 122a) and a tape frame (e.g., second type of substrate 112b) having a plurality of chiplets (e.g., plurality of chiplets 206) via a second cleaning chamber (e.g., second wet clean chamber 122b). In some embodiments, the method 600 is performed within a single multi-chamber processing tool (e.g., multi-chamber processing tool 100).

The method 600, at 604, includes inspecting, via a first metrology system (e.g., one of the metrology systems 118), the substrate for pre-bond defects in a first metrology chamber (e.g., one or more metrology chambers 150) and the tape frame for pre-bond defects in a second metrology chamber (e.g., one or more metrology chambers 150). In some embodiments, the pre-bond defects comprise particles, cracks, or chips greater than a threshold value in the substrate or the tape frame. The threshold value may be a suitable value after which the particles, crack, or chips would adversely affect the performance of a bonded substrate (e.g., bonded substrate 402). In some embodiments, the pre-bond defects comprises particles, cracks, or chips greater than a threshold valve and disposed at a critical region of the substrate or the tape frame, for example, at or proximate the one or more metal pads 310 or the one or more second metal pads 404. In some embodiments, the method 600 includes performing a second cleaning process or second degas process prior to bonding if pre-bond defects are found on the substrate or the tape frame. In some embodiments, the method 600 includes discarding the plurality of chiplets 206 having pre-bond defects in the form of crack or chips greater than the threshold value.

The method 600, at 606, includes bonding one or more of the plurality of chiplets to the substrate via a hybrid bonding process in a bonder chamber (e.g., bonder chamber 140) to form the bonded substrate. The method 600, at 608 includes performing, via a second metrology system different than the first metrology system, a post-bond inspection of the bonded substrate via a third metrology chamber (e.g., one or more metrology chambers 150) for post-bond defects. In some embodiments, the first metrology chamber, the second metrology chamber, and the third metrology chamber are different chambers. In some embodiments, the first metrology chamber, the second metrology chamber, and the third metrology chamber are the same chamber. In some embodiments, at least two of the first metrology chamber, second metrology chamber, and the third metrology chamber are different chambers.

In some embodiments, the post-bond defects comprise voids, misalignments, or delamination. In some embodiments, the method 600 includes using data from the post-bond inspection to adjust a parameter of the bonder chamber if post-bond defects are found on the substrate or the tape frame. In some embodiments, the post-bond inspection is performed using an infrared inspection system or near infrared inspection system capable of penetrating the dielectric layers of the plurality of chiplets to provide imagery of a bonding interface between the substrate and the plurality of chiplets.

The data, imagery, or measurements obtained from the metrology system 118 may be used to modify any upstream or downstream processes of hybrid bonding. The upstream or downstream processes may be in-situ or ex-situ (i.e., outside the multi-chamber processing tool 100). For example, if the second type of substrates 112b, or tape frame substrates, have varying amounts of unwanted particle counts and come from different singulation tools within a fabrication plant, particles count measurements may be used to identity the singulation tools that are associated with higher particles counts on the tape frame substrates. The method may include, for example, cleaning or adjusting a parameter of such singulation tools to reduce particle counts. In another non-limiting example, if a certain level of roughness of the one or more metal pads 310 is detected via the metrology system 118 during a pre-bond inspection, a parameter of the bonder chamber 140 during bonding or a parameter of a post-bond anneal may be refined to minimize any resultant voids post-bond.

In some embodiments, the method 600 is performed to qualify the multi-chamber processing tool 100. For example, the data, imagery, or measurements obtained from the metrology system 118 may be used for qualification of the multi-chamber processing tool 100 to determine readiness of use. In some embodiments, the data, imagery, or measurements obtained from the metrology system 118 may be used for maintenance or re-certification of an already qualified multi-chamber process tool 100.

While the foregoing is directed to embodiments of the present disclosure, other and further embodiments of the disclosure may be devised without departing from the basic scope thereof.

The invention claimed is:

1. A multi-chamber processing tool for bonding chiplets to a substrate, comprising:

An equipment front end module (EFEM) having one or more substrate loadports for receiving the substrate and one or more tape frame loadports for receiving a tape frame having a plurality of chiplets; and a plurality of automation modules having a first automation module coupled to the EFEM, wherein each of the plurality of automation modules include a transfer chamber and one or more process chambers coupled to the transfer chamber, wherein the one or more process chambers include a bonder chamber, wherein the transfer chamber includes a buffer configured to hold one or more of the substrates and one or more tape frames, and wherein the transfer chamber includes a transfer robot configured to transfer the substrate and the tape frames between the buffer, the one or more process chambers, and a buffer disposed in an adjacent automation module of the plurality of automation modules;

a first metrology chamber coupled to one of the plurality of automation modules, wherein the first metrology chamber includes a first metrology system configured to obtain measurements of the substrate and a motion system configured to align the first metrology system to various parts of the substrate; and a second metrology chamber coupled to one of the plurality of automation modules, wherein the second metrology chamber includes a second metrology system different than the first metrology system and configured to obtain measurements of the substrate and a second motion system configured to align the second metrology system to various parts of the substrate.

2. The multi-chamber processing tool of claim 1, wherein the first metrology chamber is directly coupled to one of the transfer chambers, and the second metrology chamber is directed coupled to another one of the transfer chambers.

3. The multi-chamber processing tool of claim 1, wherein the first metrology chamber is directly coupled to the bonder chamber.

4. The multi-chamber processing tool of claim 1, wherein the first metrology system includes an infrared microscope and the second metrology system includes a light microscope or ultraviolet microscope.

5. The multi-chamber processing tool of claim 1, wherein the first metrology system is configured for obtaining weight-based measurements, electrical field measurements, radiation measurements, or ultrasonic measurements.

6. The multi-chamber processing tool of claim 1, further comprising a third metrology chamber coupled to one of the plurality of automation modules, wherein the third metrology chamber includes a third metrology system configured to obtain measurements of the substrate.

* * * * *